(12) United States Patent
Lee et al.

(10) Patent No.: US 11,699,500 B2
(45) Date of Patent: Jul. 11, 2023

(54) STORAGE DEVICE AND OPERATING METHOD THEREOF

(71) Applicant: SK hynix Inc., Gyeonggi-do (KR)

(72) Inventors: Jong Ha Lee, Gyeonggi-do (KR); Min Hwan Moon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/502,590

(22) Filed: Oct. 15, 2021

(65) Prior Publication Data

US 2022/0336036 A1 Oct. 20, 2022

(30) Foreign Application Priority Data

Apr. 16, 2021 (KR) .......................... 10-2021-0049973

(51) Int. Cl.
*G11C 29/42* (2006.01)
*G11C 29/12* (2006.01)
*G11C 29/44* (2006.01)

(52) U.S. Cl.
CPC .......... *G11C 29/42* (2013.01); *G11C 29/1201* (2013.01); *G11C 29/12005* (2013.01); *G11C 29/4401* (2013.01)

(58) Field of Classification Search
CPC .............. G11C 29/42; G11C 29/12005; G11C 29/1201; G11C 29/4401
See application file for complete search history.

(56) References Cited

U.S. PATENT DOCUMENTS

| | | | |
|---|---|---|---|
| 2014/0047269 A1* | 2/2014 | Kim ..................... | G11C 11/5642 714/16 |
| 2022/0093199 A1* | 3/2022 | Shirakawa ............. | G11C 29/20 |
| 2022/0180953 A1* | 6/2022 | Na ......................... | G11C 16/26 |
| 2022/0180957 A1* | 6/2022 | Yang ...................... | G11C 7/106 |
| 2022/0245028 A1* | 8/2022 | Okamoto ............. | G11C 29/023 |
| 2023/0044073 A1* | 2/2023 | Kim .................... | G11C 16/0483 |

FOREIGN PATENT DOCUMENTS

| KR | 1020150029404 A | 3/2015 |
|---|---|---|
| KR | 101925384 B1 | 2/2019 |
| KR | 1020190022987 A | 3/2019 |

* cited by examiner

*Primary Examiner* — Tuan T Nguyen
(74) *Attorney, Agent, or Firm* — IP & T Group LLP

(57) ABSTRACT

A storage device includes a memory device and a memory controller. The memory device stores a history read table including root bit information, read voltage information, and error bit information on each of a plurality of memory blocks, and performs a read operation of reading data stored in the plurality of memory blocks based on the history read table. When the read operation fails, a memory controller changes a level of a read voltage, and controls the memory device to perform a read retry operation of retrying the read operation by using the changed read voltage. When the read retry operation passes, the memory controller determines whether the history read table is to be updated by comparing the root bit information of the read retry operation with the root bit information of the history read table.

20 Claims, 12 Drawing Sheets

|       | Root Bit | Read Bias | Error Bit |
|-------|----------|-----------|-----------|
| BLK 1 |          |           |           |
| BLK 2 |          |           |           |
| ...   |          |           |           |
| BLK i | 1        | 5         | 20        |
| ...   |          |           |           |
| BLK z |          |           |           |

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0049973 filed on Apr. 16, 2021, the entire disclosure of which is incorporated by reference herein.

BACKGROUND

Field of Invention

The present disclosure generally relates to an electronic device, and more particularly, to a storage device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a storage device having an improved history read table and an operating method of the storage device.

In accordance with an aspect of the present disclosure, a storage device includes: a memory device configured to store a history read table including root bit information, read voltage information, and error bit information on each of a plurality of memory blocks, and perform a read operation of reading data stored in the plurality of memory blocks based on the history read table; and a memory controller configured to: change, when the read operation fails, a level of a read voltage, and control the memory device to perform a read retry operation of retrying the read operation by using the changed read voltage; and determine, when the read retry operation passes, whether the history read table is to be updated by comparing the root bit information of the read retry operation with the root bit information of the history read table.

In accordance with another aspect of the present disclosure, a method for operating a storage device including a plurality of memory blocks includes: performing a read operation of reading data stored in the plurality of memory blocks, based on a history read table including root bit information, read voltage information, and error bit information on each of the plurality of memory blocks; changing, when the read operation fails, a level of a read voltage, and performing a read retry operation of retrying the read operation by using the changed read voltage; comparing, when the read retry operation passes, the root bit information of the read retry operation with the root bit information of the history read table; and determining whether the history read table is to be updated according to a result of the comparing.

In accordance with another aspect of the present disclosure, an operating method of a controller includes: controlling a memory device to perform a read operation on a memory unit according to information on the memory unit, wherein the information includes root bit information, read voltage information and error bit count for the memory unit and the information is included in a history read table; controlling, when the read operation fails, the memory device to perform a read retry operation on the memory unit by changing a read voltage; and updating the history read table when the read retry operation has succeeded and when the root bit information of the read retry operation is the same as the root bit information within the history read table, or the root bit information of the read retry operation is different from the root bit information within the history read table and the error bit count of the read retry operation is smaller than the error bit count within the history read table.

BRIEF DESCRIPTION OF THE DRAWINGS

Various embodiments will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

The present disclosure may apply various changes and different shapes, therefore the embodiments of the present disclosure are only illustrated in details with particular examples. However, the examples are not limited to certain shapes but apply to all the changes, equivalent material and replacement elements. The drawings included are illustrated in a fashion where the figures are expanded for the better understanding. In describing the embodiments, a description of technologies that are known in the art and are not directly related to the present disclosure is omitted. This is to further clarify the gist of the present disclosure without clutter.

Hereinafter, various embodiments of the present disclosure will be described in detail with reference to the accompanying drawings in order for those skilled in the art to be able to readily implement the technical spirit of the present disclosure.

Figure 1:
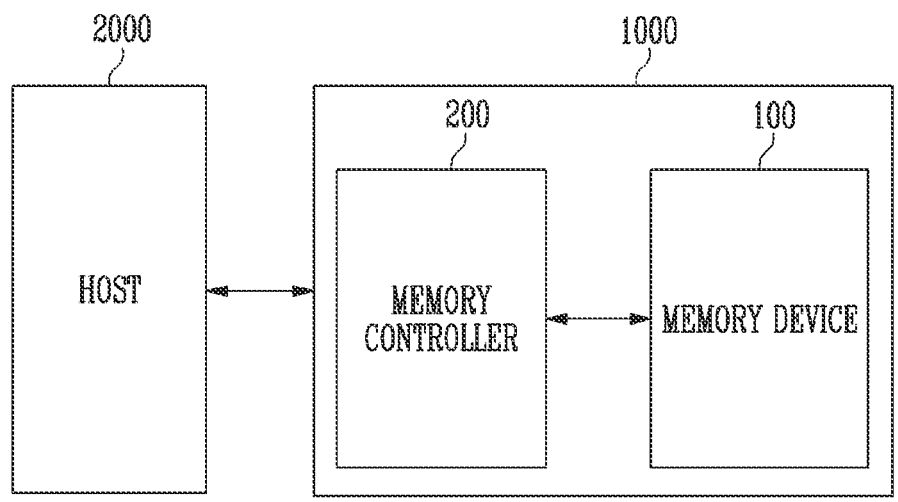
FIG. 1 is a block diagram illustrating a storage device in accordance with an embodiment of the present disclosure.

FIG. 1 is a block diagram illustrating a storage device 1000 in accordance with an embodiment of the present disclosure.

Referring to FIG. 1, the storage device 1000 may include a memory device 100 and a memory controller 200.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any of various types of storage devices according to a host interface that is a communication scheme with the host 2000. For example, the storage device 1000 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal in Flash Storage (UFS) device, a Compact Flash (CF) card, a Smart Media Card (SMC), a memory stick, and the like.

The storage device 1000 may be implemented as any of various package types. For example, the storage device 1000 may be implemented as any of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command and an address from the memory controller 200. The memory device 100 may access an area selected by the received address in the memory cell array. That the memory device 100 accesses the selected area may mean that the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may mean an operation in which the memory device 100 reads data from the area selected by the address. The erase operation may mean an operation in which the memory device 100 erases data stored in the area selected by the address.

In accordance with an embodiment of the present disclosure, the memory device 100 may include a history read table 60. The memory device 100 may include the history read table 60 including read information associated with a read voltage at which a read operation is performed. Also, when the read operation performed with reference to the history read table 60 fails, the memory device 100 may perform a read retry operation of retrying the read operation by changing a level of the read voltage. The memory device 100 may perform the read retry operation and then update a result of the read retry operation in the history read table 60.

The memory controller 200 may control overall operations of the storage device 1000. Specifically, when power is applied to the storage device 1000, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells in which data included in the memory device 100 is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program in operation, the memory controller 200 may provide a program command, a PBA, and data to the memory device 100, In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any request from the host 2000. For example, the memory controller 200 may control the memory device 100 to perform a program operation, a read operation, or an erase operation, which is used to perform a background operation such as wear leveling, garbage collection, or read reclaim.

The host 2000 may communicate with the storage device 1000, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a MultiMedia Card (MMC), an embedded MMC (eMMC), a Dual In-line Memory Module (DIMM), a Registered DIMM (RDIMM), and a Load Reduced DIMM (LRDIMM).

Figure 2:
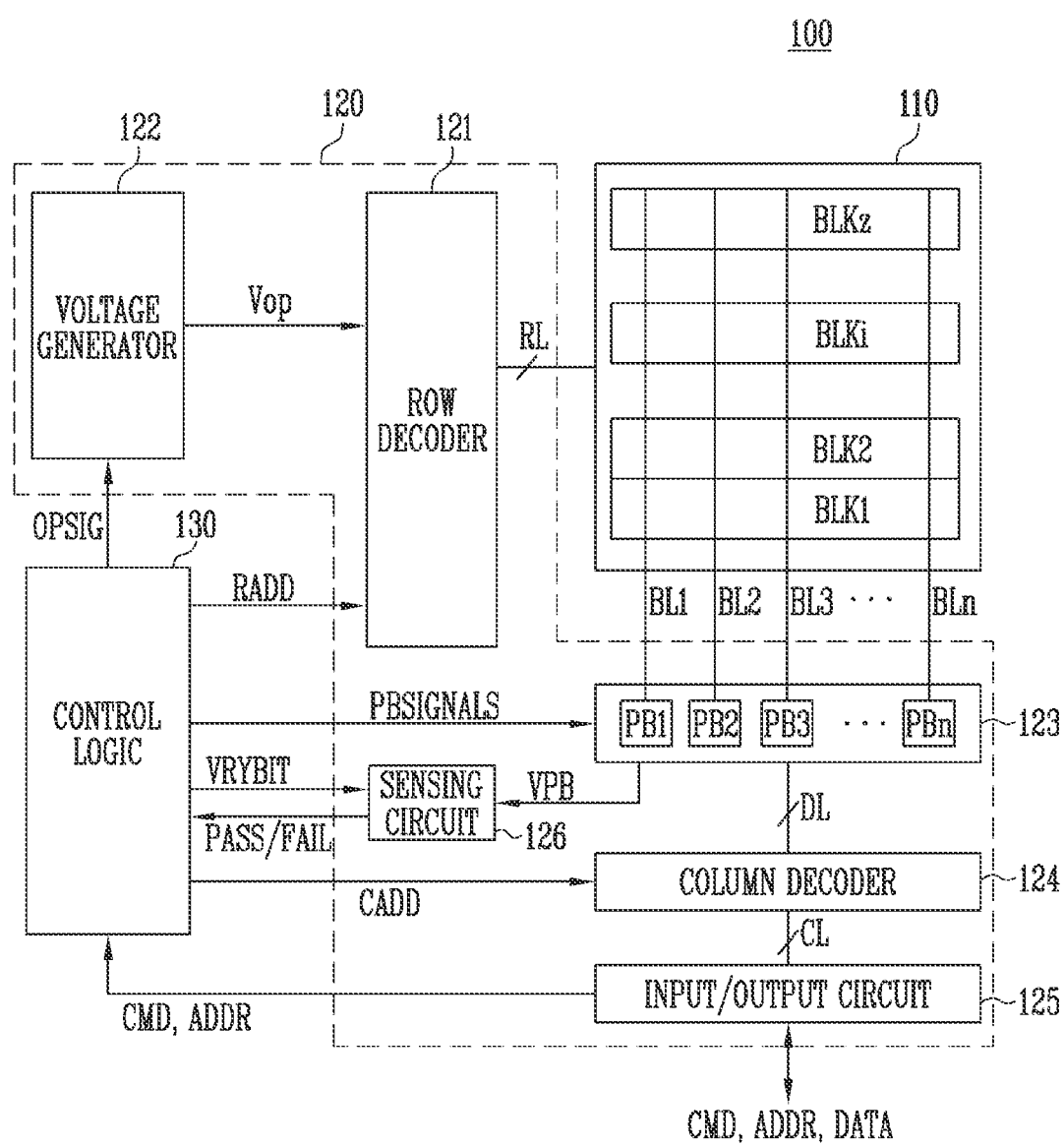
FIG. 2 is a block diagram illustrating a memory device in accordance with an embodiment of the present disclosure.

FIG. 2 is a block diagram illustrating a memory device 100 in accordance with an embodiment of the present disclosure.

Referring to FIG. 2, the memory device 100 may include a in memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL, The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data hits.

The peripheral circuit 120 may be configured to perform a program operation, a read operation or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the hit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130, Specifically, the row decoder 121 may decode the row address RADD. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erased voltage, and the like under the control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a in plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. Specifically, the first to nth bit lines BL1 to BLn may operate in response to page buffer control signals PBSIGNALS, For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example, the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a pass PASS or a fail signal FAIL by comparing a sensing voltage VPB received from the page buffer group 123 and a reference voltage generated by the reference current.

The control logic 130 may control the peripheral circuit 120 by in outputting the operation signal OPSIG, the row address RAD©, the page buffer control signals PBSIG-NALS, and the allow bit VRYBIT in response to the command CMD and the address ADDR.

Also, the control logic 130 may determine whether the verify operation has passed or failed in response to the pass or fail signal PASS or FAIL. Also, the control logic 130 may control the page buffer group 123 to temporarily store verify information including the pass or fail signal PASS or FAIL in the page buffer group 123. Specifically, the control logic 130 may determine a program state of a memory cell in response to the pass or fail signal PASS or FAIL. For example, when the memory cell operates as a Triple Level Cell (TLC), the control logic 130 may determine whether the program state of the memory cell is any of an erase state E or first to seventh program states P1 to P7.

Figure 3:
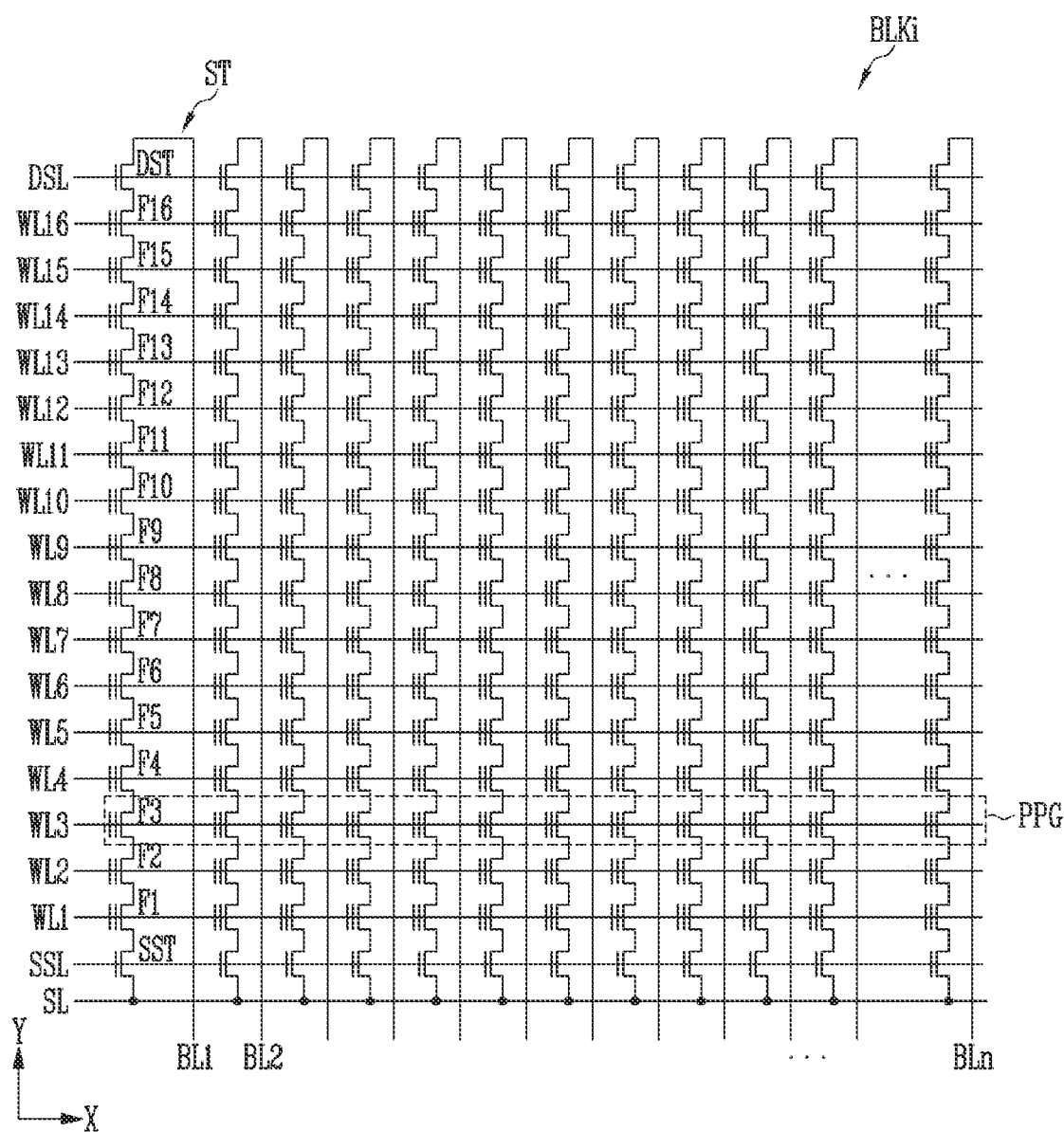
FIG. 3 is a diagram illustrating a memory block in accordance with an embodiment of the present disclosure.

FIG. 3 is a diagram illustrating a memory block BLKi in accordance with an embodiment of the present disclosure.

Referring to FIG. 3, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DAT, which are connected in series to each other between the source line SL and the first bit line BL1. At least one source select transistor SST and at least one drain select transistor DST may be included in one string ST, and a number of memory cells greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells F1 to F16 may be connected to a plurality of word lines WL1 to WL16. A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single Level Cell (SLC) storing one data bit, a Multi-Level Cell (MLC) storing two data in bits, a Triple Level Cell (TLC) storing three data bits, or a Quad Level Cell (QLC) storing four data bits.

The SLC may store one-bit data. One physical page PG of the SLC may store one logical page (LPG) data. The one LPG data may include a number of data bits corresponding to that of cells included in the one physical page PG.

The MLC, the TLC, and the QLC may store two or more-bit data. One physical page PG may store two or more LPG data.

Figure 4:
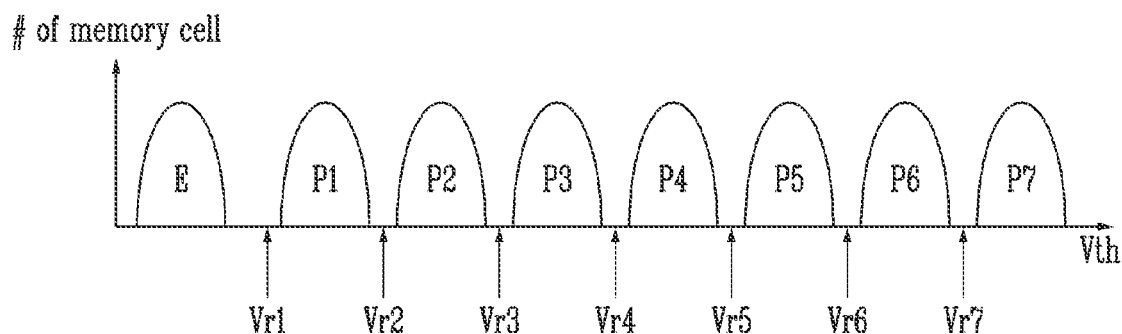
FIG. 4 is a diagram illustrating a read operation in accordance with an embodiment of the present disclosure.

FIG. 4 is a diagram illustrating a read operation in accordance with an embodiment of the present disclosure.

Referring to FIG. 4, a memory cell may be programmed to an erase state E or one of first to seventh program states P1 to P7 according to a threshold voltage (Vth). Although the memory cell shown in FIG. 4 is illustrated as a Triple Level Cell (TLC) which can be programmed to one erase state and seven program states, this is merely an embodiment for convenience of description. The memory cell may be implemented as a Multi-Level Cell (MLC), a Single Level Cell (SLC), a Quad Level Cell (QLC), or the like. In addition, for convenience of description, the erase state and the program states are distinguished from each other, but the erase state may be expressed as a zeroth program state P0. Therefore, the erase state E and the first to seventh program states P1 to P7, which are shown in FIG. 4, may be expressed as the zeroth to seventh program states.

Memory cells connected to a selected word line may have a threshold voltage included in any state among the erase state E and the in first to seventh program states P1 to P7. That is, the memory cells may be programmed to have a threshold voltage included in any state among the erase state E and the first to seventh program states P1 to P7. The memory cells may be in the erase state E before a program operation is performed. In the program operation, the memory cells in the erase state E may be programmed to any program state among the seven program states, when a program voltage is applied to the selected word line.

In addition, the erase state E and the first to seventh program states P1 to P7 of memory cells ay be distinguished from each other by using read voltages. Specifically, the read operation may include a sensing operation of applying a read voltage to each memory cell, and identifying whether the memory cell is an on-cell or off-cell by checking a state of current flowing according to the applied read voltage or a voltage of the memory cell. In the sensing operation, the storage device 1000 may set a read voltage, based on a threshold voltage value of memory cells, and identify whether the memory cells are on-cells or off-cells by using the set read voltage. Specifically, in the erase state E and the first program state P1, memory cells may be divided into on cells and off cells by a first read voltage Vr1. In the first program state P1 and the second program state P2, memory cells may be divided into on cells and off cells by a second read voltage Vr2, In the second program state P2 and the third program state P3, memory cells may be divided into on cells and off cells by a third read voltage Vr3. In the third program state P3 and the fourth program state P4, memory cells may be divided into on cells and off cells by a fourth read voltage Vr4. In the fourth program state P4 and the fifth program state P5, memory cells may be divided into on cells and off cells by a fifth read voltage Vr5. In the fifth program state P5 and the sixth program state P6, memory cells may be divided into on cells and off cells by a sixth read voltage Vr6. In the sixth program state P6 and the seventh program state P7, memory cells may be divided into on cells and off cells by a seventh read voltage Vr7. That is, in the sensing operation, the storage device 1000 may identify whether the memory cell are on-cells or off-cells by setting the level of the read voltage to be higher than a maximum value of an on-cell distribution to be identified, and setting the level of the read voltage to be lower than a minimum value of an off-cell distribution.

In addition, the read operation may include a decoding operation of identifying an on-distribution and an off-distribution of a plurality of memory cells and converting the identified distribution of the memory cells into data. Specifically, the storage device 1000 may identify a distribution of a specific memory cell by applying the first to seventh read voltages Vr1 to Vr7 to the specific memory cell. For example, when the specific memory cell is programmed to the fourth program state P4, the specific memory cell may be sensed as an off-cell when the first to fourth read voltages are applied to the specific memory cell. The specific memory cell may be sensed as an on-cell when the fifth to seventh read voltages are applied to the specific memory cell. In addition, the storage device 1000 may identify that the specific memory cell has been programmed to the fourth program state P4 by combining the sensed results. The storage in device 1000 may identify program states of a plurality of memory cells in the same manner, and convert a distribution of the memory cells into data by combining the identified program states.

Figure 5:
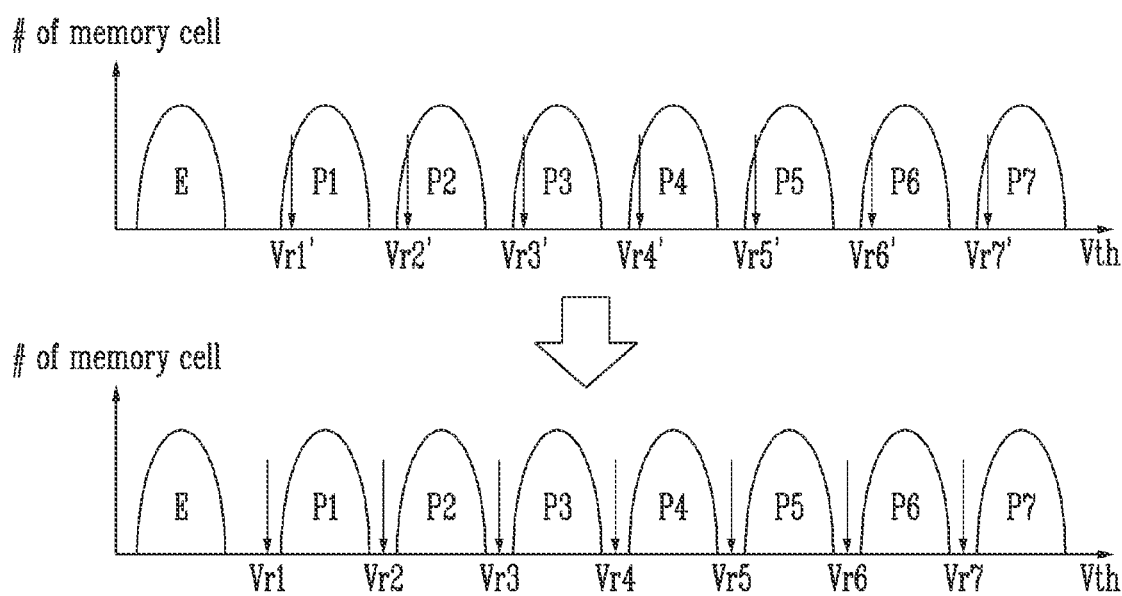
FIG. 5 is a diagram illustrating a read fail and a read retry operation in accordance with an embodiment of the present disclosure.

FIG. 5 is a diagram illustrating a read fail and a read retry operation in accordance with an embodiment of the present disclosure.

Referring to FIG. 5, a distribution of memory cells programmed to the erase state E and the first to seventh program states P1 to P7 is illustrated.

In the sensing operation, when a read voltage having a level at which program states of memory cells cannot be clearly distinguished from each other, a read fail may occur, in which a result of the read operation cannot be trusted, Specifically, when an applied voltage level is applied lower than the maximum value of the on-cell distribution or is applied higher than the minimum value of the off-cell distribution, the read fail may occur. For example, when the level of a read voltage for distinguishing the erase state E and the first program state P1 from each other is Vr1', some of the memory cells operating as off-cells may operate as on-cells. Similarly, when one of read voltages Vr2' to Vr7' for distinguishing the other program states (e.g., the second to seventh program states P2 to P7 from each other) is set to an inappropriate level, an error may be included in read data.

In addition, in the decoding operation, the storage device 1000 may perform error correction decoding on erroneously read data. The storage device 1000 may correct the erroneously read data through the error correction decoding. For example, the storage device 1000 may in perform the error correction decoding of correcting an error bit of data by using a parity bit generated in a low density parity check (LDPC) encoding process. However, when an error bit occurs which is equal to or greater than a threshold value of an error bit correctable through the error correction decoding, the storage device 1000 may determine that the read operation has failed.

The storage device 1000 may perform a read retry operation of retrying the read operation by changing a level of a read voltage when the read fail occurs. The storage device 1000 may determine a level of a read voltage at which the read operation passes by repeatedly performing the read retry operation. For example, the storage device 1000 may determine a level of the first read voltage as Vr1. Similarly, the storage device 1000 may determine levels of the second to seventh read voltages as Vr2 to Vr7.

Figures 6, 7:
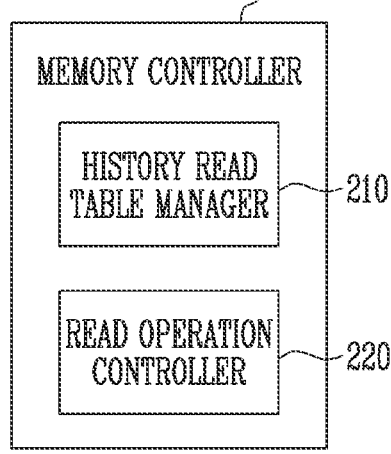
FIG. 6 is a diagram illustrating a history read table in accordance with an embodiment of the present disclosure.
FIG. 7 is a diagram illustrating a memory controller in accordance with an embodiment of the present disclosure.

FIG. 6 is a diagram illustrating a history read table 60 in accordance with an embodiment of the present disclosure.

Referring to FIG. 6, the history read table 60 may include read information including a root bit 61, a read bias 62, and an error bit 63 for each memory block. The read information may be information on a read operation which passes.

In addition, the storage device 1000 may perform a read operation with reference to the history read table 60. For example, when the storage device 1000 performs a read operation on any page included in an i-th memory block BLKi among a plurality of memory blocks, the storage device 1000 may perform the read operation with reference to read information in on the i-th memory block BLKi in the history read table 60. Specifically, the storage device 1000 may perform the read operation with reference to information on the root bit 61, the read bias 62, and the error bit 63 with respect to the corresponding memory block.

Before a first read operation on a specific memory block is completed, the storage device 1000 may perform a second read operation on the same memory block. When a read fail occurs in both the first read operation and the second read operation, a read retry operation on each of the first read operation and the second read operation may be performed. In addition, an update of the history read table 60 may be problematic as the read retry operation on the first read operation and the second read operation compete with each other.

In accordance with an embodiment of the present disclosure, the storage device 1000 may determine whether the history read table 60 is to be updated by using the root bit 61. The storage device 1000 may determine whether the history read table 60 is to be updated by comparing a root bit of the defense operation with the root bit 61 of the history read table 60. In an embodiment, when a root bit of a read retry operation and the root bit 61 of the history read table 60 are the same, the storage device 1000 may update the history read table 60 as read information of the read retry operation. The read information of the read retry operation may include a level of a read voltage of the read retry operation which passes and an error bit number.

In an embodiment, the root bit 61 may be flipped, when the in history read table 60 is updated. Also, the root bit 61 may be stored as '0' or '1.'

The read bias 62 may include information on a read voltage. In an embodiment, in a read operation, the storage device 1000 may perform the read operation with reference to the read bias 62. The storage device 1000 may update the level of the read voltage in the read bias 62, when the history read table 60 is updated.

The error bit 63 may include information on an error. In an embodiment, the error bit 63 may mean an error number occurring when the read operation is performed by using the corresponding read bias. In an embodiment, the storage device 1000 may update the history read table 60 according to a result obtained by comparing an error bit of the read retry operation with the error bit 63 of the history read table 60.

FIG. 7 is a diagram illustrating a memory controller 200 in accordance with an embodiment of the present disclosure.

Referring to FIG. 7, the memory controller 200 may include a history read table manager 210 and a read operation controller 220.

The history read table manager 210 may control the memory device 100 to update the history read table 60. Specifically, when a read operation corresponding to a read request received from the host 2000 fails, the storage device 1000 may perform a read retry operation of changing a level of a read voltage and retrying the read operation using the changed read voltage. In addition, when the read retry operation passes, the history read table manager 210 may compare root bit information of the read retry operation with root bit information of the history read table 60. The history read table manager 210 may update the history read table 60 according to a result obtained by comparing the root bit information of the read retry operation with the root bit information of the history read table 60.

Specifically, when the root bit information of the read retry operation and the root bit information of the history read table 60 are the same, the history read table manager 210 may control the memory device 100 to update the history read table 60. The history read table manager 210 may update the history read table 60, based on read information of the read retry operation. The read information of the read retry operation may include read voltage information and error bit information.

When the root bit information of the read retry operation and the root bit information of the history read table 60 are different from each other, the history read table manager 210 may compare error bit information of the read retry operation with error bit information of the history read table 60. In addition, when an error bit number of the read retry operation is smaller than that of the history read table 60, the history read table manager 210 may update the history read table 60 with the read information of the read retry operation.

The read operation controller 220 may control the memory device 100 to perform the read operation and the read retry operation. Specifically, when the read operation controller 220 receives a read request from the host 2000, the read operation controller 220 may control the memory device 100 to perform the read operation, based on the history in read table 60. Also, the read operation controller 220 may read root bit information, read voltage information, and error bit information, which correspond to a memory block, from the history read table 60 in response to the read request of the host 2000.

In an embodiment, when the read retry operation passes, the read operation controller 220 may temporarily store root bit information, read voltage information, and the error bit information of the read retry operation which passes.

Figure 8:
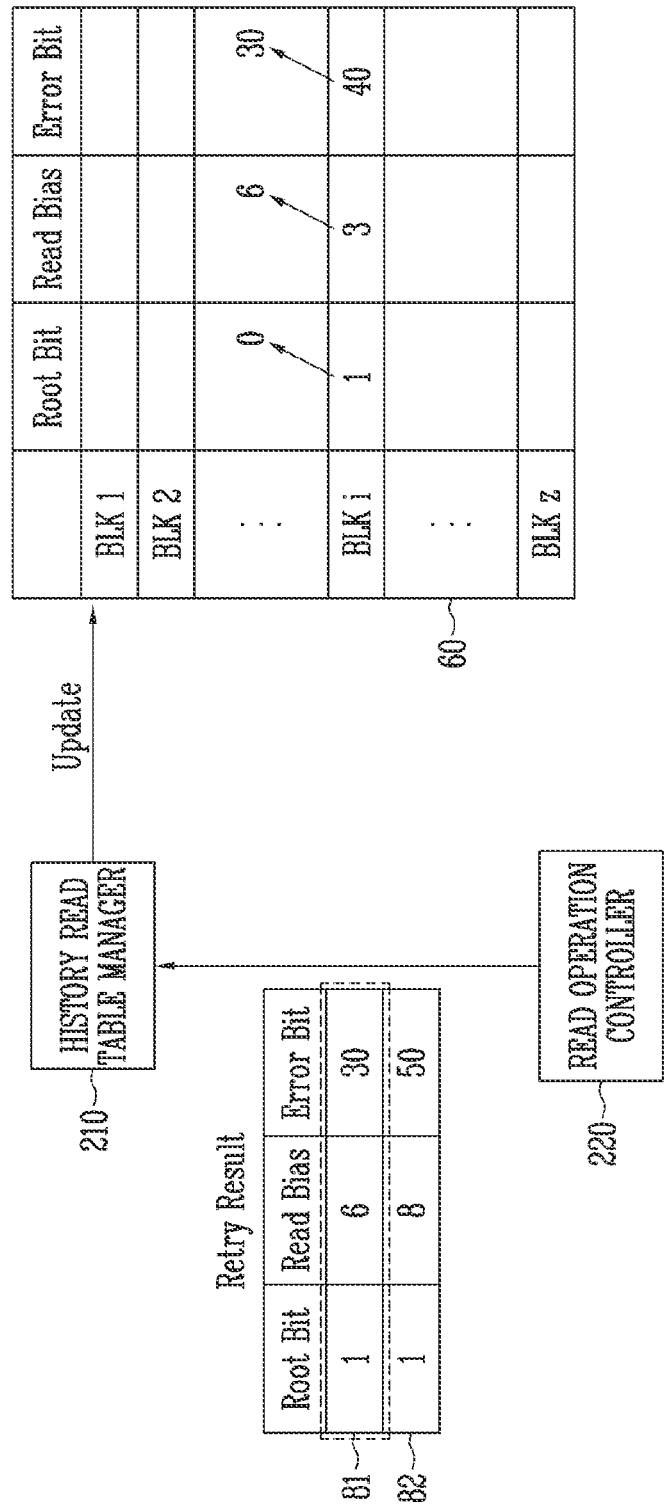
FIG. 8 is a diagram illustrating a method for updating the history read table in accordance with an embodiment of the present disclosure.
Figure 9:
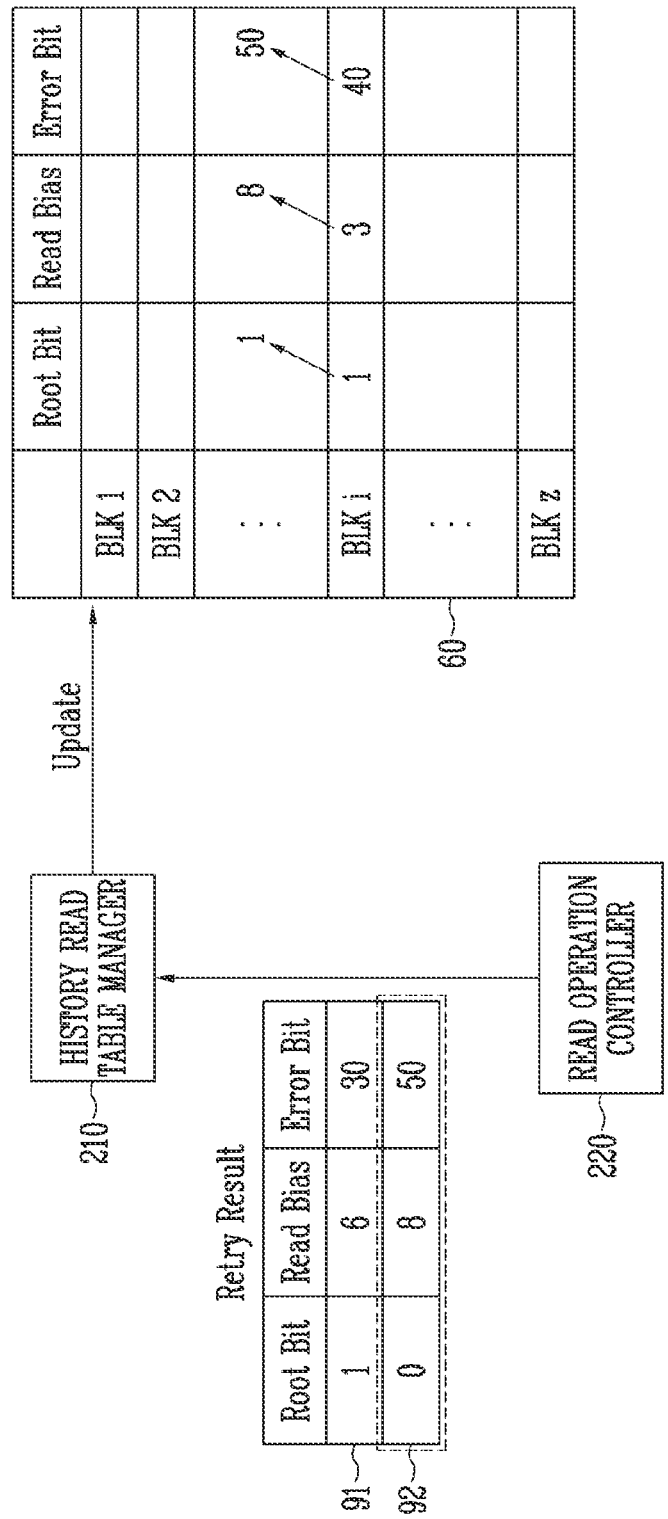
FIG. 9 is a diagram illustrating a method for updating the history read table in accordance with an embodiment of the present in disclosure.

FIGS. 8 and 9 are diagrams illustrating a method for updating the history read table in accordance with an embodiment of the present disclosure.

Referring to FIGS. 8 and 9, a process is illustrated, in which the history read table manager 210 and the read operation controller 220 update the history read table 60. In FIGS. 8 and 9, a read retry operation and results thereof, which correspond to a specific block (e.g., BLKi), are shown.

The read operation controller 220 may temporarily store read information including a root bit, a read voltage, and an error bit from the history read table 60 in a read operation. Also, the read operation controller 220 may perform the read operation and the read retry operation, based on the temporarily stored read information. When the read retry operation passes, the read operation controller 220 may provide the history read table manager 220 with a result of the read retry operation which passes.

In addition, the history read table manager 210 may update in the history read table 60, based on the result of the read retry operation, which is received from the read operation controller 220. Specifically, the history read table manager 210 may receive, from the read operation controller 220, the result of the read retry operation which passes, e.g., read information including a root bit, a read voltage, and an error bit. Also, the history read table manager 210 may compare a root bit of the history read table 60 with a root bit of the read retry operation. When the root bit of the history read table 60 and the root bit of the read retry operation are the same, the history read table manager 210 may update the history read table 60. Also, when the root bit of the history read table 60 and the root $2u$ bit of the read retry operation are different from each other, the history read table manager 210 may compare an error bit of the history read table 60 with an error bit of the read retry operation. When the error bit of the read retry operation is smaller than that of the history read table 60, the history read table manager 210 may update the history read table 60 with the read information of the read retry operation.

Referring to FIG. 8, the history read table manager 210 may receive first read information 81 and second read information 82 from the read operation controller 220. The history read table manager 210 may compare a root bit of the history read table 60 with a root bit received from the read operation controller 220. A root bit of the first read information 81 is '1' equal to the root bit of the history read table 60, and therefore, the history read table manager 210 may update the first read information 81 in the history read table 60. When the history read table manager 210 in updates the history read table 60, the history read table manager 210 may flip the root bit. The history read table manager 210 may update the root bit as '0,' update the read bias as '6,' and update the error bit as '30.'

Also, the history read table manager 210 may compare the updated history read table 60 with the second read information 82. A root bit of the updated history read table 60 is '0' different from that of the second read information 82, and therefore, the history read table manager 210 may compare an error bit of the updated history read table 60 with an error bit of the second read information 82. The error bit of the second read information 82 is greater than that of the updated history read table 60, and therefore, the history read table manager 210 may not update the history read table 60 with the second read information.

Referring to FIG. 9, the history read table manager 210 may receive first read information 91 and second read information 92 from the read operation controller 220. The history read table manager 210 may compare a root bit of the history read table 60 with a root bit received from the read operation controller 220. A root bit of the first read information 91 is '1' equal to the root bit of the history read table 60, and therefore, the history read table manager 210 may update the history read table 60 with the first read information 91. When the history read table manager 210 updates the history read table 60, the history read table manager 210 may flip the root bit corresponding to the first read information 91, The history read table manager 210 may update the root bit as '0,' update the read bias as '6,' and update the error bit as '30' within the history read table 60 due to the first read information 91.

The history read table manager 210 may compare the updated history read table 60 with the second read information 92. A root bit of the updated history read table 60 is '0' equal to that of the second read information 92, and therefore, the history read table manager 210 may update the updated history read table 60 with the second read information 92. The history read table manager 210 may flip the root bit. The history read table manager 210 may update the root bit as '1,' update the read bias as '8,' and update the error bit as '50.'

Referring to the value '0' as the root bit of the second read information 92, the second read information 92 may indicate that the read retry operation has been performed according to read information other than updated due to the first read information 91 within the history read table 60, That is, the second read information 92 may indicate a case where a read operation fails although the read operation has been performed by using the read information updated due to the first read information 91 within the history read table 60. Within the history read table 60 updated due to the first read information 91, the read information corresponding to the read operation may have the root bit of the value '0,' the read bias of the value '6,' and the error bit of the value '30'. As the read operation fails, the read retry operation may be performed and may pass according to the second read information 92 having the root bit of the value '0,' the read bias of the value '8,' and the error bit of the value '50'. Therefore, the second read information 92 may indicate that the read retry operation has been performed according to the read information other than updated due to the first read information 91 within the history read table 60. Therefore, an error bit of the second read information 92 is greater than that of the history read table 60 updated due to the first read information 91, but the second read information 92 may be read information more reliable than that of the history read table 60 updated with the first read information 91.

Figure 10:
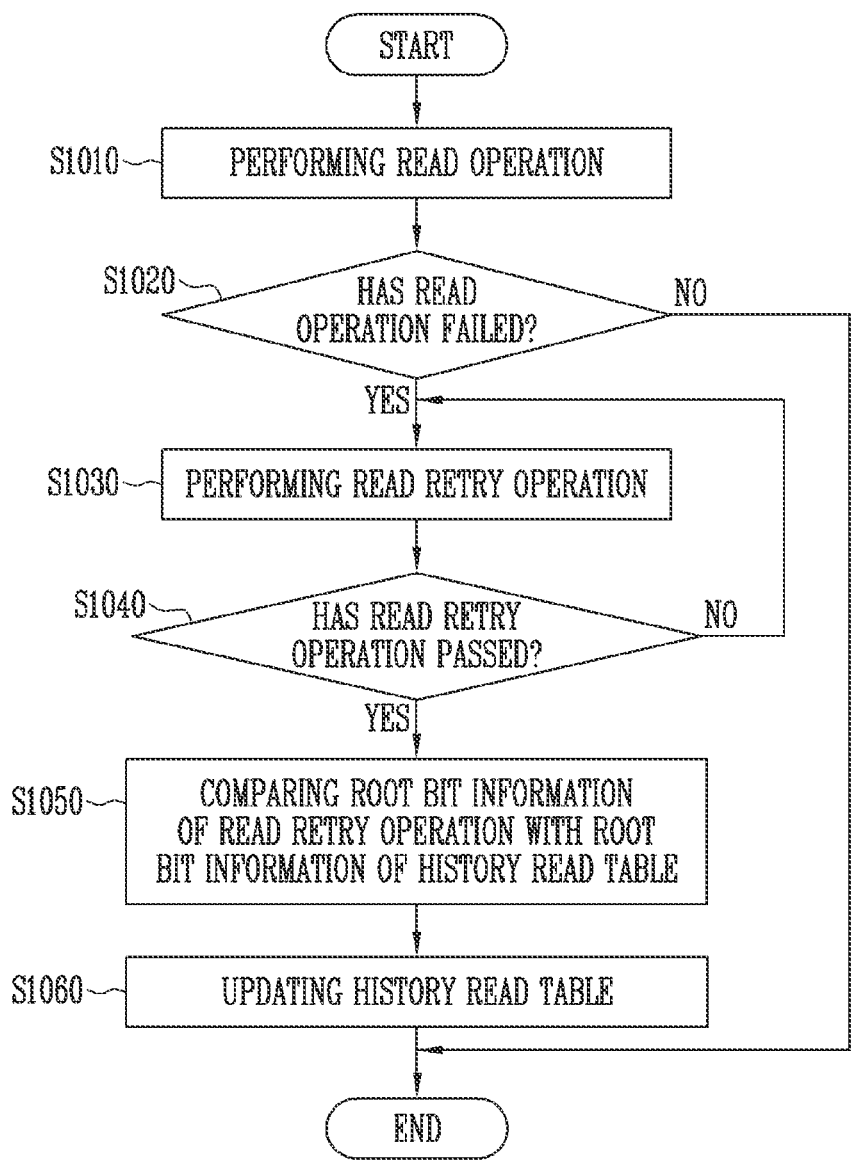
FIG. 10 is a diagram illustrating an operating method of the storage device in accordance with an embodiment of the present disclosure.

FIG. 10 is a diagram illustrating an operating method of the storage device in accordance with an embodiment of the present disclosure.

Referring to FIG. 10, the storage device 1000 may perform a read operation in response to a read request received from the host 2000 (S1010). Specifically, the storage device 1000 may perform the read operation on a memory block corresponding to the read request, based on the history read table 60. In an embodiment, the storage device 1000 may receive a read request from the host 2000, and read, to the memory controller, root bit information, read voltage information, and error bit information, which correspond to a memory block corresponding to the read request from the history read table 60.

Also, when the read operation fails (S1020—YES), the storage device 1000 may perform a read retry operation of retrying the read operation by changing a level of a read voltage (S1030), The storage device 1000 may change the level of the read voltage until the read retry operation passes, and repeatedly perform the read operation of reading the memory device at the changed level of the read voltage.

Also, when the read retry operation passes (S1040—YES), the storage device 1000 may compare root bit information of the read retry operation with the root bit information of the history read table 60 (S1050). The storage device 1000 may determine whether the history read table 60 is to be updated according to the comparison result. Specifically, when the read retry operation passes, the storage device 1000 may temporarily store root bit information, read voltage information, and error bit information of the read retry operation which passes.

The storage device 1000 may determine whether the history read table 60 is to be updated according to the comparison result. When the root bit information of the read retry operation and the root bit information of the history read table 60 are the same, the storage device 1000 may update the history read table 60 (S1060).

In an embodiment, when the root bit information of the read retry operation and the root bit information of the history read table 60 are different from each other, the storage device 1000 may compare the error bit information of the read retry operation with the error bit information of the history read table 60. When an error bit number of the read retry operation is smaller than that of the history read table 60, the storage device 1000 may update the history read table 60.

In an embodiment, the history read table 60 may store the root bit information as '0' or '1.' In an embodiment, when the history read table 60 is updated, the root bit information of the history read table 60 may be flipped.

Figure 11:
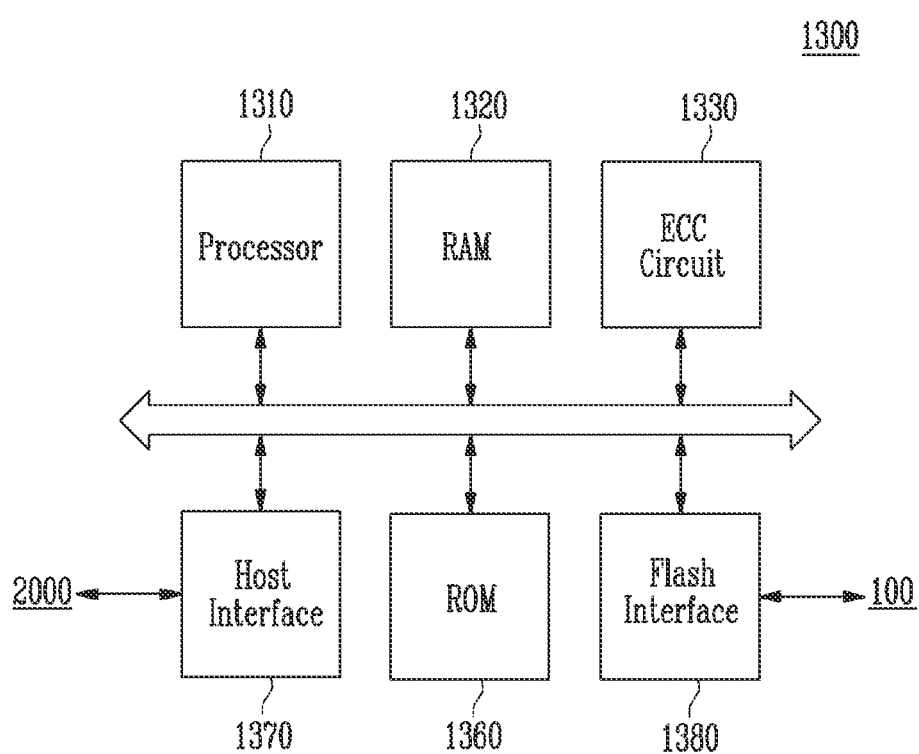
FIG. 11 is a diagram illustrating a memory controller in accordance with an embodiment of the present disclosure.

FIG. 11 is a diagram illustrating a memory controller 1300 in accordance with an embodiment of the present disclosure.

Referring to FIG. 11, the memory controller 1300 may include a processor 1310, a RAM 1320, and an Error Checking and Correction (ECC) circuit 1330, a ROM 1360, a host interface 1370, and a flash interface 1380. The memory controller 1300 shown in FIG. 11 may be an embodiment of the memory controller 200 shown in FIG. 1 or 7.

The processor 1310 may communicate with the host 2000 by using the host interface 1370, and perform a logical operation to control an operation of the memory controller 1300. For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Hash Translation Layer (FTL). The processor 250 may translate a Logical Block Address (LBA) provided by the host 2000 into a Physical Block Address (PBA) through the FTL. The FTL may receive an LBA input by using a mapping table, to translate the LBA into a PBA. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as a buffer memory, a working memory, or a cache memory of the processor 1310. Also, the RAM 1320 may store codes and commands, which the processor 1310 executes. The RAM 1320 may store data processed by the processor 1310. The RAM 1320 may be implemented as a Static RAM (SRAM) or a Dynamic RAM (DRAM).

The ECC circuit 1330 may detect an error in a program operation or a read operation, and correct the detected error. Specifically, the ECC circuit 1330 may perform an error correction operation according to an Error Correction Code. Also, the ECC circuit 1330 may perform ECC encoding, based on data to be written to the memory device 100. The data on which the ECC encoding is performed may be transferred to the memory device 100 through the flash interface 1380. Also, the ECC circuit 1330 may perform ECC decoding on data received from the memory device 100 through the flash interface 1380.

The ROM 1360 may be used as a storage unit for storing various information necessary for an operation of the memory controller 1300. Specifically, the ROM 1360 may include a map table, and physical-to-logical address information and logical-to-physical address information may be stored in the map table. Also, the ROM 1360 may be controlled by the in processor 1310.

The host interface 1370 may include a protocol for exchanging data between the host 2000 and the memory controller 1300. Specifically, the host interface 1370 may communicate with the host 2000 through at least one of various communication standards or interfaces such 1s as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 by using a communication protocol under the control of the processor 1310. Specifically, the flash interface 1380 may communicate a command, an address, and data with the memory device 100 through a channel. For example, the flash interface 1380 may include a NAND interface.

Figure 12:
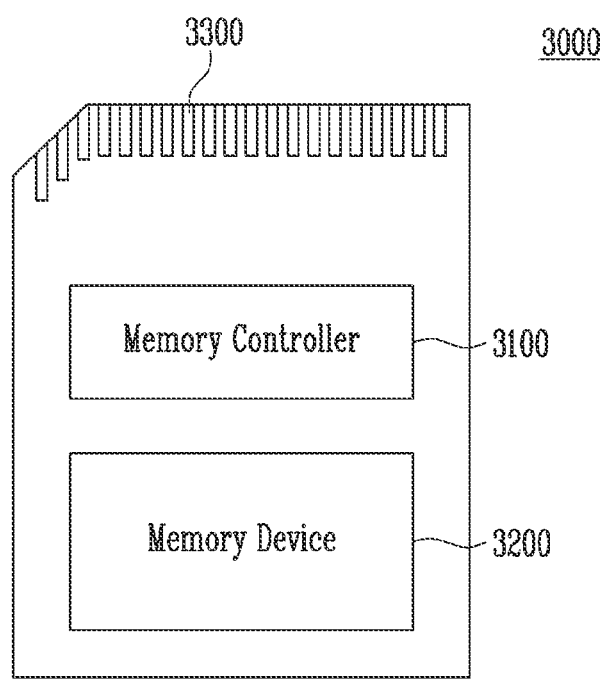
FIG. 12 is a diagram illustrating a memory card system in accordance with an embodiment of the present disclosure.

FIG. 12 is a diagram illustrating a memory card system 3000 in accordance with an embodiment of the present disclosure.

Referring to FIG. 12, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as a Random Access Memory (RAM), a processing unit, a host interface, a memory interface, and the error corrector 233.

The memory controller 3100 may communicate with an external device through the connector 3300, The memory controller 3100 may communicate with the external device (e.g., the host) according to a specific communication protocol. The memory controller 3100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), firewire, a Universal Hash Storage (UFS), Wi-Fi, Bluetooth, and NVMe.

The memory device 3200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Hash (CF) card, a Smart Media Card (SM and SMC), a memory stick, a Multi-Media Card (e.g., MMC, RS-MMC, MMCmicro and eMMC), a secure digital (SD) card (e.g., SD, miniSD, microSD and SDHC), and a Universal Flash Storage (UFS), FIG. 13 is a diagram illustrating a Solid State Drive (SSD) system 4000 in accordance with an embodiment of the present disclosure.

Figure 13:
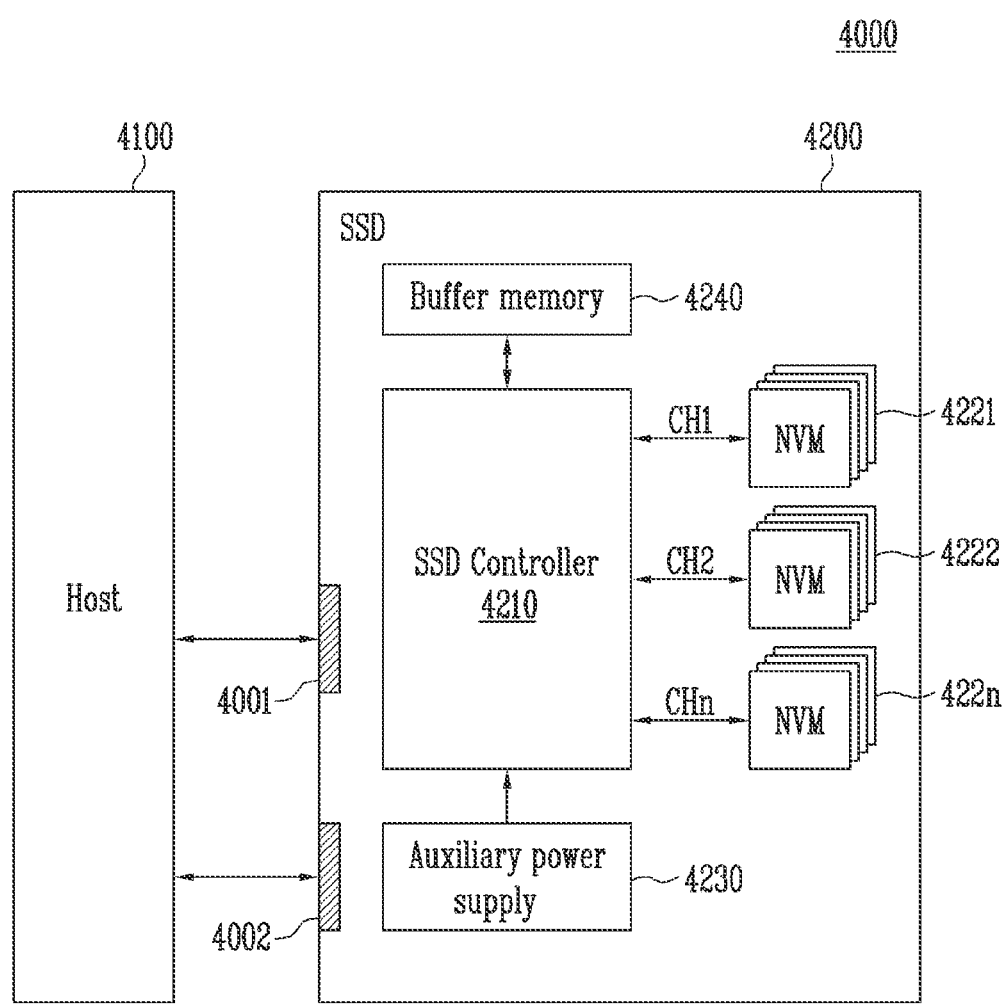
FIG. 13 is a diagram illustrating a Solid State Drive (SSD) system in accordance with an embodiment of the present disclosure.

Referring to FIG. 13, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422n in response to a signal SIG received from the host 4100. The signal SIG may be a signal based on an interface between the host 4100 and the SSD 4200. For example, the signal SIG may be a signal defined by at least one in of communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), a firewire, a Universal Flash Storage (UFS), a WI-FT, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power to the SSD 4200. The auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n, The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 14:
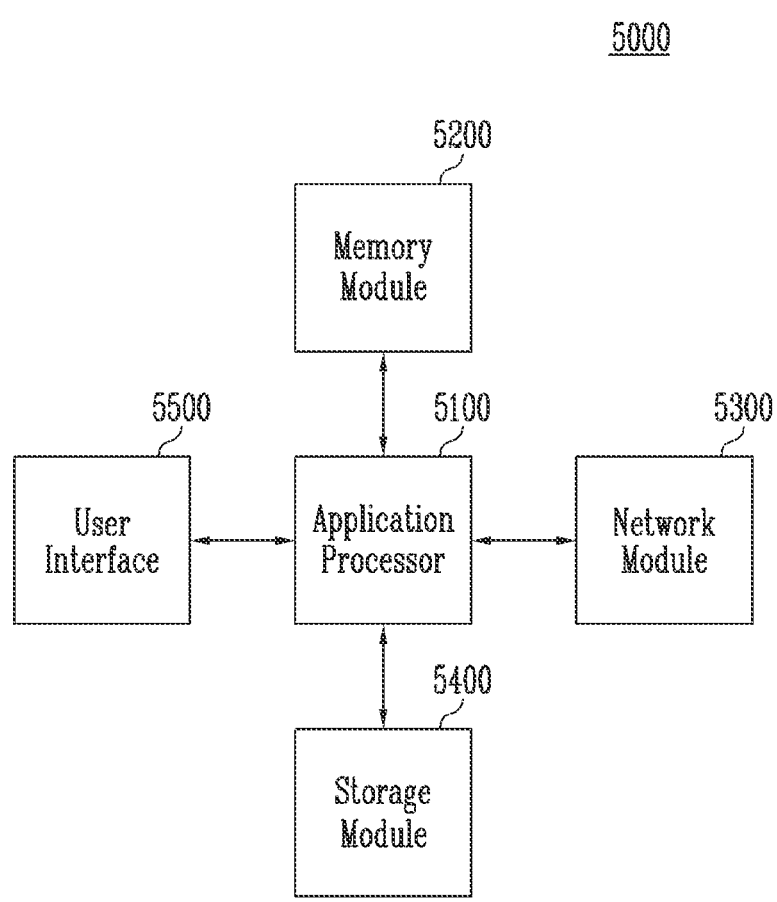
FIG. 14 is a diagram illustrating a user system in accordance with an embodiment of the present disclosure.

FIG. 14 is a diagram illustrating a user system 5000 in accordance with an embodiment of the present disclosure.

Referring to FIG. 14, the user system 5000 includes an application processor 5100, a memory module 5200, a network module 5300, a storage module 5400, and a user interface 5500.

The application processor 5100 may drive components included in the user system 5000, an operating system (OS), a user program, or the like. The application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 5100 and the memory module 5200 may be provided as one semiconductor package by being packaged based on a Package on Package (PoP).

The network module 5300 may communicate with external devices. The network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 5300 may be included in the application processor 5100.

The storage module 5400 may store data. For example, the storage module 5400 may store data received from the application processor 5100. Alternatively, the storage module 5400 may transmit data stored therein to the application processor 5100. The storage module 5400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 5400 may be provided as a removable drive such as a memory card of the user system 5000 or an external drive.

The storage module 5400 may include a plurality of nonvolatile memory devices, and the plurality of nonvolatile memory devices may operate identically to the memory device 100 described with reference to FIGS. 1 to 3. The storage module 4400 may operate identically to the storage device 1000 described with reference to FIG. 1.

The user interface 5500 may include interfaces for inputting data or commands to the application processor 5100 or outputting data to an external device. The user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there is provided a storage device having an improved read history table and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Various embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A storage device comprising:
a memory device configured to store a history read table including root bit information, read voltage information, and error bit information on each of a plurality of memory blocks, and perform a read operation of reading data stored in the plurality of memory blocks based on the history read table; and
a memory controller configured to:
change, when the read operation fails, a level of a read voltage and control the memory device to perform a read retry operation of retrying the read operation by using the changed read voltage, and
determine, when the read retry operation passes, whether the history read table is to be updated by comparing the root bit information of the read retry operation with the root bit information of the history read table.

2. The storage device of claim 1, wherein the memory controller includes a read operation controller configured to control, when a read request is received from a host, the memory device to perform the read operation and the read retry operation on a memory block based on the history read table.

3. The storage device of claim 2, wherein the read operation controller is further configured to read the root bit information, the read voltage information, and the error bit information, which correspond to the memory block, from the history read table in response to the read request.

4. The storage device of claim 3, wherein the read operation controller is further configured to temporarily store, when the read retry operation passes, the root bit information, the read voltage information, and the error bit information of the read retry operation which passes.

5. The storage device of claim 1, wherein the memory controller includes a history read table manager configured to:
compare the root bit information of the read retry operation with the root bit information of the history read table, and
control the memory device to update the history read table.

6. The storage device of claim 5, wherein the history read table manager controls the memory device to update the history read table when the root bit information of the read retry operation and the root bit information of the history read table are the same.

7. The storage device of claim 5, wherein the history read table manager is further configured to compare the error bit information of the read retry operation with the error bit information of the history read table when the root bit information of the read retry operation and the root bit information of the history read table are different from each other.

8. The storage device of claim 7, wherein the history read table manager updates the history read table when the error bit information of the read retry operation is smaller than that of the history read table.

9. The storage device of claim 1, wherein the memory controller is further configured to store the root bit information of the history read table as '0' or '1'.

10. The storage device of claim 9, wherein the memory controller is further configured to change, when the history read table is updated, the root bit information of the history read table.

11. A method for operating a storage device including a plurality of memory blocks, the method comprising:
performing a read operation of reading data stored in the plurality of memory blocks based on a history read table including root bit information, read voltage information, and error bit information on each of the plurality of memory blocks;
changing, when the read operation fails, a level of a read voltage and performing a read retry operation of retrying the read operation by using the changed read voltage;
comparing, when the read retry operation passes, the root bit information of the read retry operation with the root bit information of the history read table; and
determining whether the history read table is to be updated according to a result of the comparing.

12. The method of claim 11, wherein the performing of the read operation includes:
receiving a read request from a host; and
reading, to a memory controller, the root bit information, the read voltage information, and the error bit information, which correspond to a memory block corresponding to the read request, from the history read table.

13. The method of claim 11, wherein the comparing includes temporarily storing, when the read retry operation passes, the root bit information, the read voltage information, and the error bit information of the read retry operation which passes.

14. The method of claim 11, wherein the determining includes updating the history read table when the root bit information of the read retry operation and the root bit information of the history read table are the same.

15. The method of claim 11, wherein the determining includes comparing the error bit information of the read retry operation with the error bit information of the history read table when the root bit information of the read retry operation and the root bit information of the history read table are different from each other.

16. The method of claim 15, wherein the comparing the error bit information includes updating the history read table when the error bit information of the read retry operation is smaller than that of the history read table.

17. The method of claim 11, wherein the history read table stores the root bit information as '0' or '1'.

18. The method of claim 17, further comprising changing the root bit information of the history read table when the history read table is updated.

19. An operating method of a controller, the operating method comprising:
controlling a memory device to perform a read operation on a memory unit according to information on the memory unit, wherein the information includes root bit information, read voltage information and error bit count for the memory unit and the information is included in a history read table;
controlling, when the read operation fails, the memory device to perform a read retry operation on the memory unit by changing a read voltage; and
updating the history read table when the read retry operation has succeeded and when:
the root bit information of the read retry operation is the same as the root bit information within the history read table, or
the root bit information of the read retry operation is different from the root bit information within the history read table and the error bit count of the read retry operation is smaller than the error bit count within the history read table.

20. The operating method of claim 19, wherein the updating includes changing the root bit information within the history read table.

\* \* \* \* \*